United States Patent
Cheng et al.

(10) Patent No.: US 10,756,506 B2
(45) Date of Patent: Aug. 25, 2020

(54) III-V PHOTONIC INTEGRATED CIRCUITS ON SILICON SUBSTRATE

(71) Applicant: INTERNATIONAL BUSINESS MACHINES CORPORATION, Armonk, NY (US)

(72) Inventors: Cheng-Wei Cheng, White Plains, NY (US); Ning Li, White Plains, NY (US); Devendra K. Sadana, Pleasantville, NY (US); Kuen-Ting Shiu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/534,554

(22) Filed: Aug. 7, 2019

(65) Prior Publication Data
US 2019/0363509 A1    Nov. 28, 2019

Related U.S. Application Data

(60) Division of application No. 15/403,883, filed on Jan. 11, 2017, now Pat. No. 10,439,356, which is a (Continued)

(51) Int. Cl.
*H01S 5/02* (2006.01)
*H01S 5/026* (2006.01)
(Continued)

(52) U.S. Cl.
CPC .......... *H01S 5/021* (2013.01); *G02B 6/12004* (2013.01); *G02B 6/1228* (2013.01);
(Continued)

(58) Field of Classification Search
CPC .......... H01S 5/021; H01S 5/026; H01S 5/343; H01S 5/04257; H01S 5/04254;
(Continued)

(56) References Cited

U.S. PATENT DOCUMENTS 4,989,934 A    2/1991  Zavracky et al.
5,815,520 A    9/1998  Furushima
(Continued)

FOREIGN PATENT DOCUMENTS

CN    102487046 A    6/2012
DE    1999141875 C2   3/2002
(Continued)

OTHER PUBLICATIONS

Li, J. et al., "Monolithic Integration of GaAs/InGaAs Lasers on Virtual Ge Substrates via Aspect-Ratio Trapping," Journal of the Electrochemical Society, May 13, 2009, vol. 156, Issue 5. (pp. H574-H578).
(Continued)

*Primary Examiner* — Dzung Tran
(74) *Attorney, Agent, or Firm* — Tutunjian & Bitetto, P.C.; Erik Johnson

(57) ABSTRACT

A semiconductor device including a substrate structure including a semiconductor material layer that is present directly on a buried dielectric layer in a first portion of the substrate structure and an isolation dielectric material that is present directly on the buried dielectric layer in a second portion of the substrate structure. The semiconductor device further includes a III-V optoelectronic device that is present in direct contact with the isolation dielectric material in a first region of the second portion of the substrate structure. A dielectric wave guide is present in direct contact with the isolation dielectric material in a second region of the second portion of the substrate structure.

20 Claims, 10 Drawing Sheets

Related U.S. Application Data continuation of application No. 14/493,022, filed on Sep. 22, 2014, now Pat. No. 9,595,805.

(51) Int. Cl.
| | |
|---|---|
| *G02B 6/12* | (2006.01) |
| *G02B 6/122* | (2006.01) |
| *G02B 6/13* | (2006.01) |
| *G02B 6/42* | (2006.01) |
| *G02B 6/136* | (2006.01) |
| *H01S 5/343* | (2006.01) |
| *H01S 5/042* | (2006.01) |

(52) U.S. Cl.
CPC ............. *G02B 6/131* (2013.01); *G02B 6/136* (2013.01); *G02B 6/42* (2013.01); *H01S 5/026* (2013.01); *H01S 5/343* (2013.01); *G02B 2006/12061* (2013.01); *G02B 2006/12078* (2013.01); *G02B 2006/12121* (2013.01); *G02B 2006/12176* (2013.01); *H01S 5/04254* (2019.08); *H01S 5/04257* (2019.08); *H01S 2301/176* (2013.01)

(58) Field of Classification Search
CPC .......... H01S 2301/176; G02B 6/12004; G02B 6/1228; G02B 6/131; G02B 6/136; G02B 6/42; G02B 2006/12061; G02B 2006/12078; G02B 2006/12121; G02B 2006/12176

See application file for complete search history.

(56) References Cited

U.S. PATENT DOCUMENTS

| | | | |
|---|---|---|---|
| 6,326,645 | B1 | 12/2001 | Kadota |
| 6,493,497 | B1 | 12/2002 | Ramdani et al. |
| 6,759,688 | B2 | 7/2004 | Preston et al. |
| 7,251,389 | B2 | 7/2007 | Lu et al. |
| 8,110,823 | B2 | 2/2012 | Bowers |
| 2005/0025909 | A1 | 2/2005 | Jurgensen et al. |
| 2007/0170417 | A1 | 7/2007 | Bowers |
| 2013/0022072 | A1 | 1/2013 | Bowers |

FOREIGN PATENT DOCUMENTS

| | | |
|---|---|---|
| JP | 01120012 A | 5/1989 |
| JP | 08195356 A | 7/1996 |
| WO | 2009110806 A1 | 9/2009 |

OTHER PUBLICATIONS

Roelkens, G., et al., "III-V/silicon Photonics for On-Chip and Intra-Chip Optical Interconnects."
List of IBM Patents or Patent Applications Treated as Related dated Jan. 11, 2017, 2 pages.
List of IBM Patents or Patent Applications Treated as Related dated Aug. 7, 2019, 2 pages.

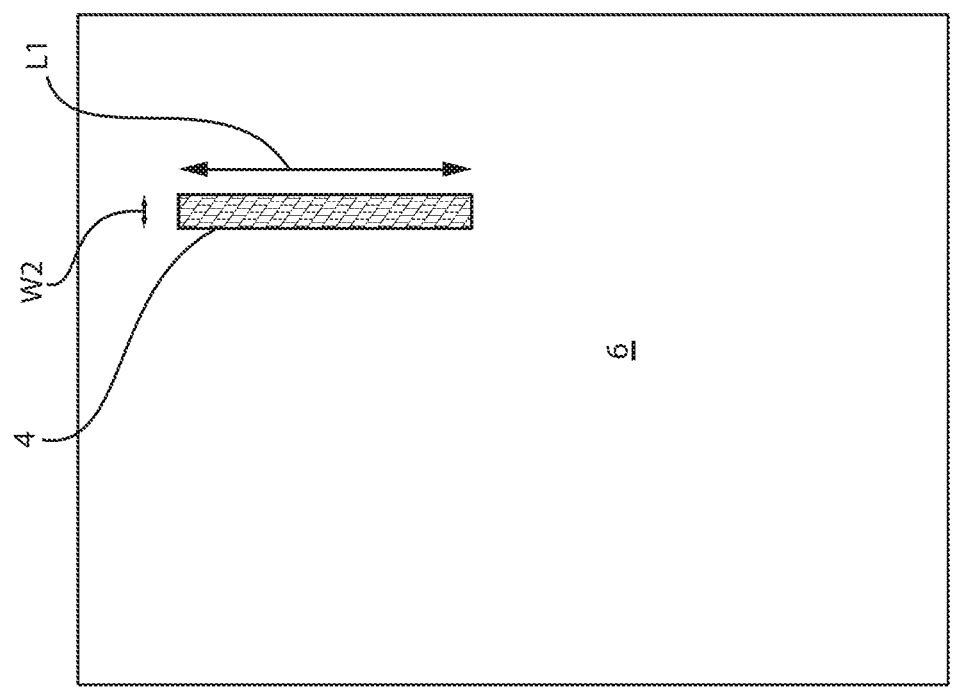
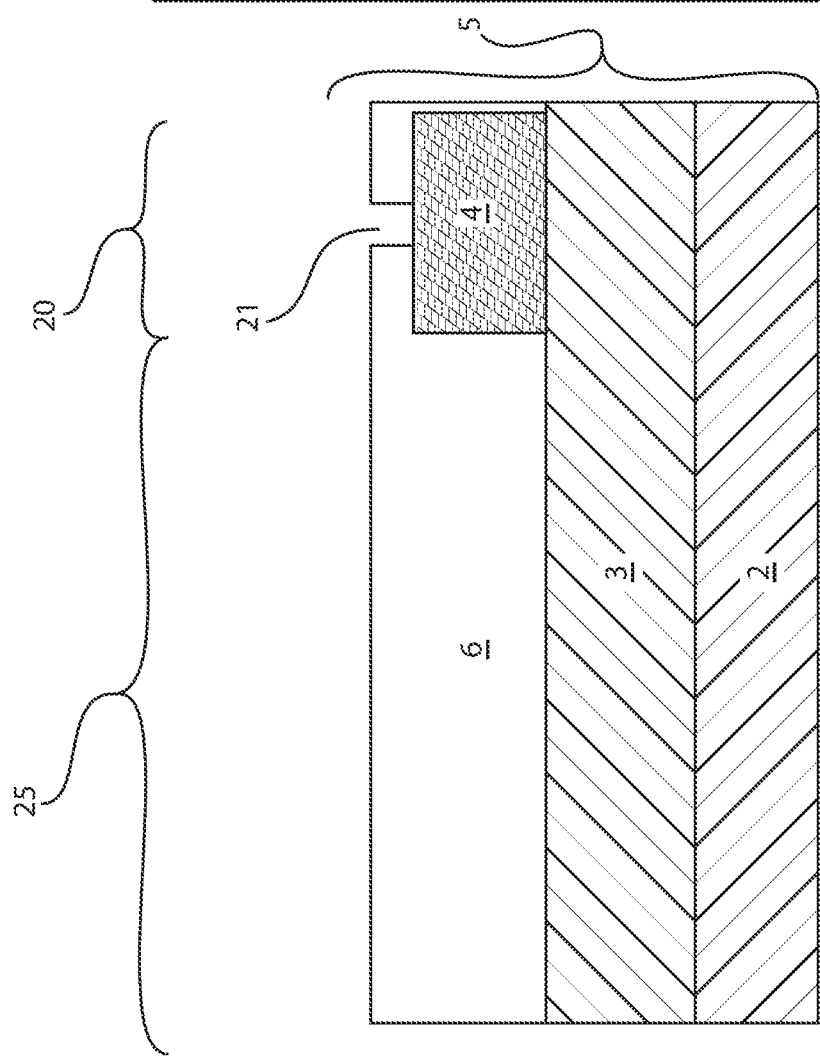
FIG. 3A
FIG. 3B

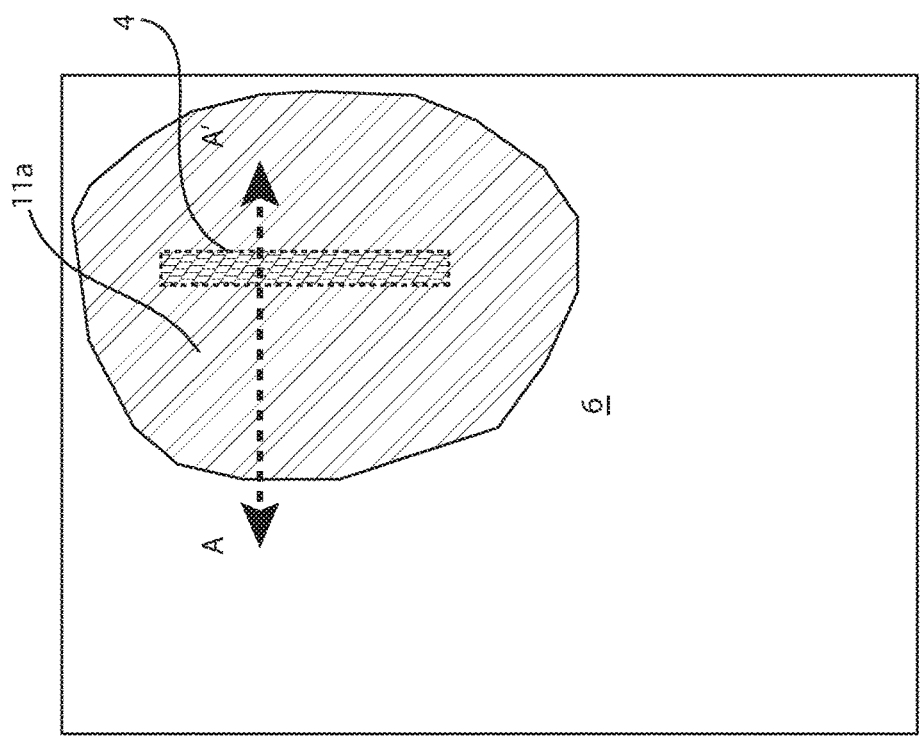
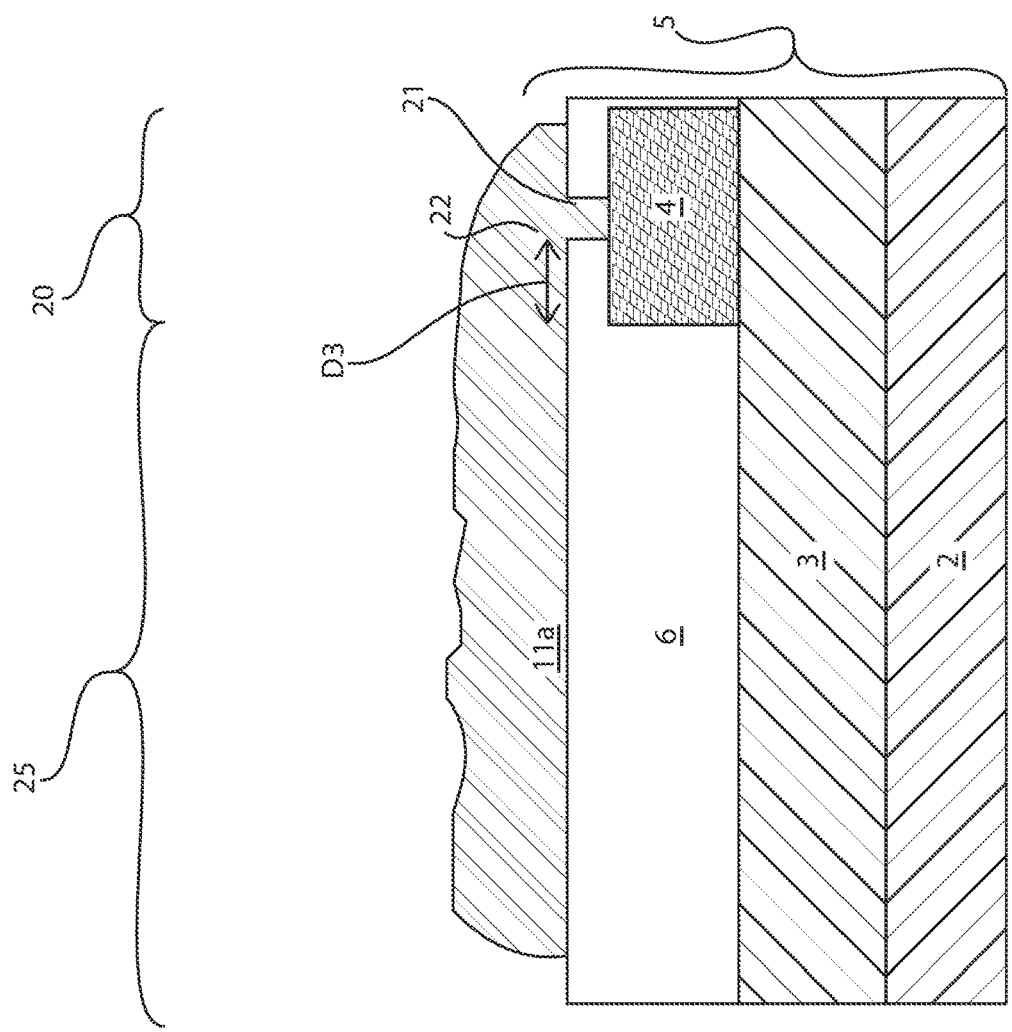
FIG. 4B
FIG. 4A

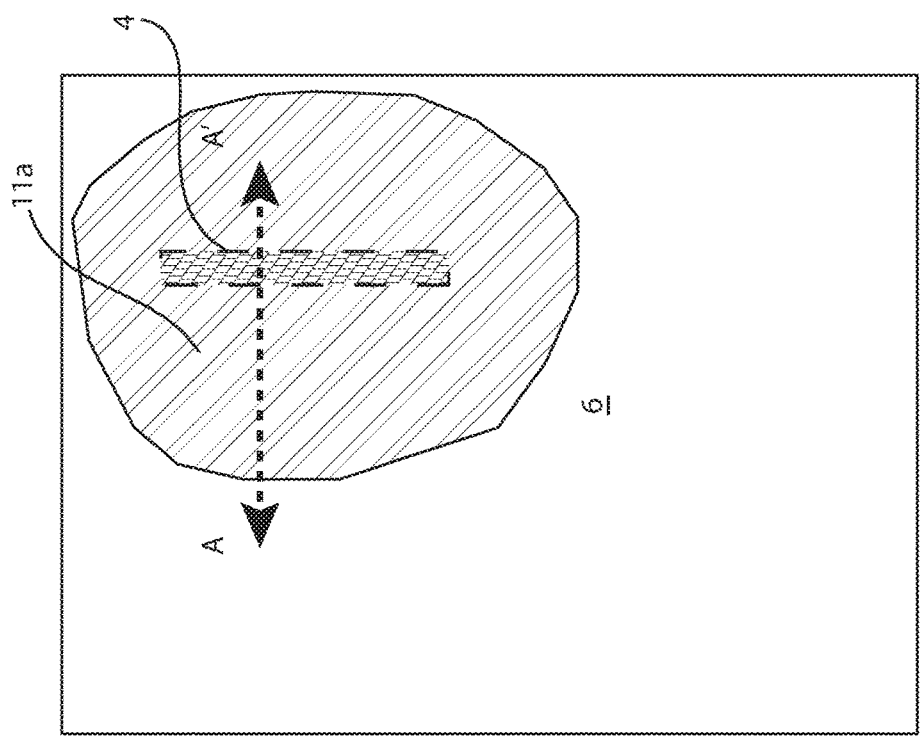
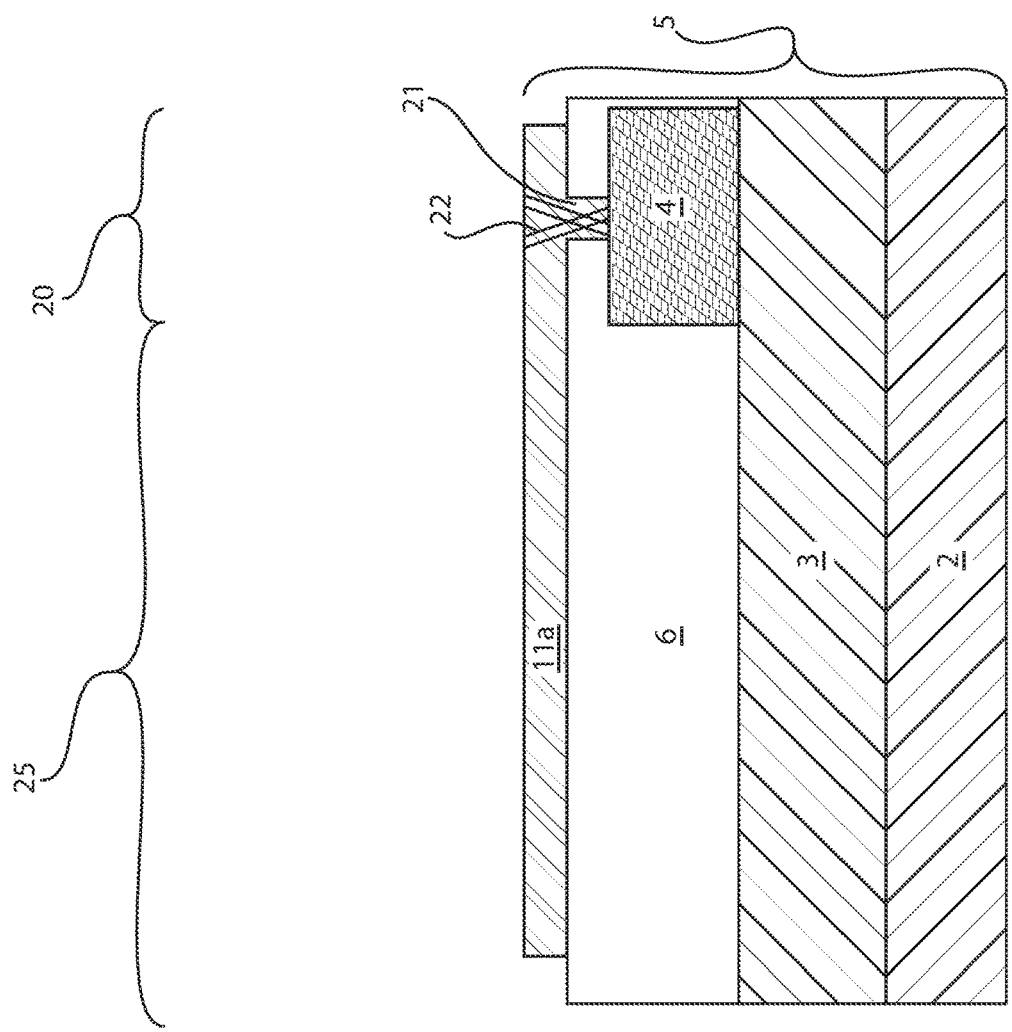
FIG. 5B
FIG. 5A

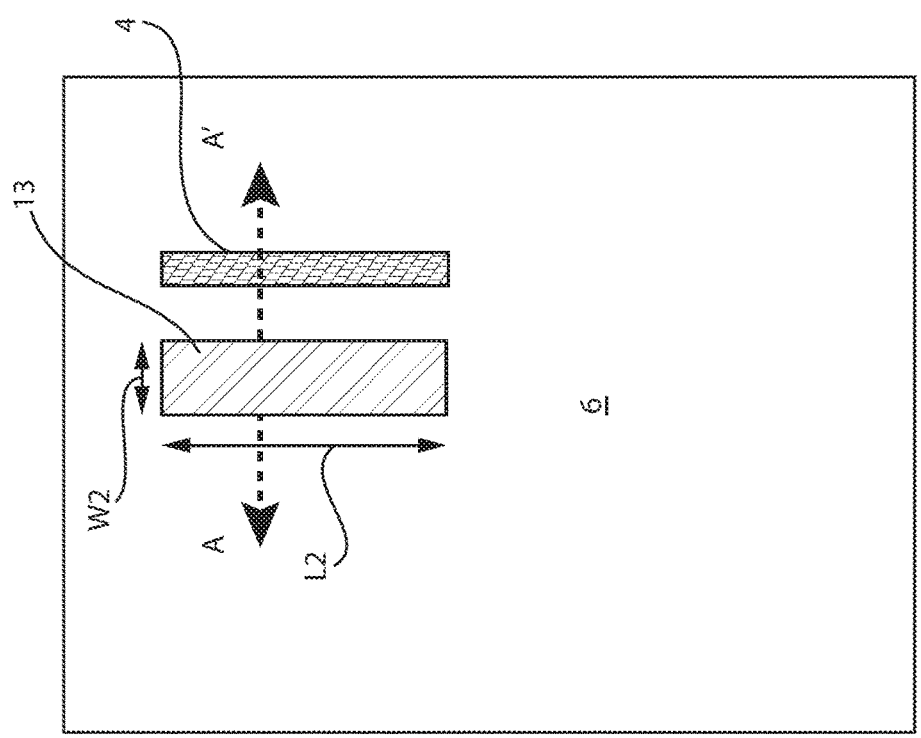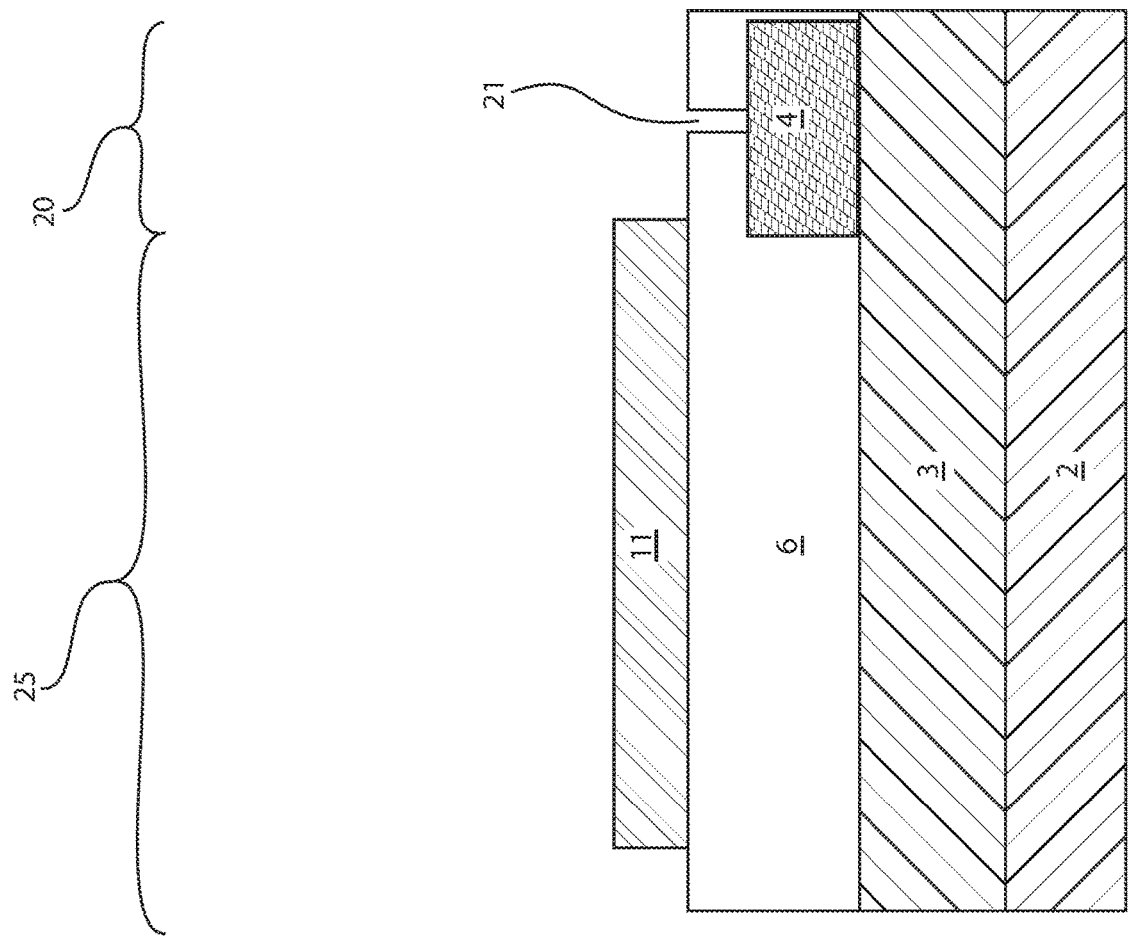
FIG. 6B
FIG. 6A

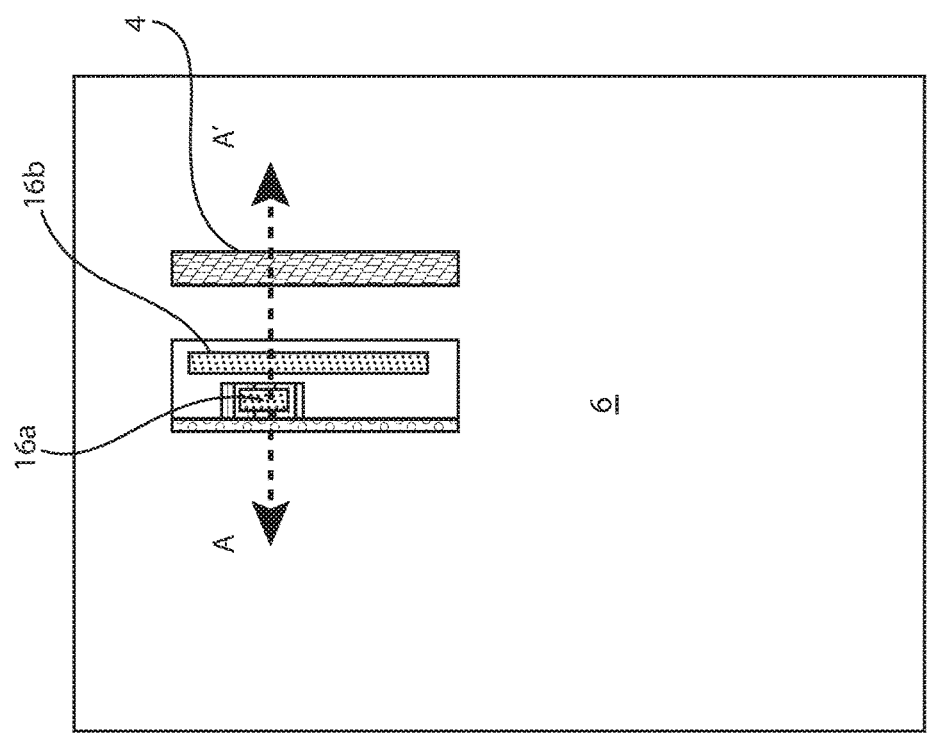
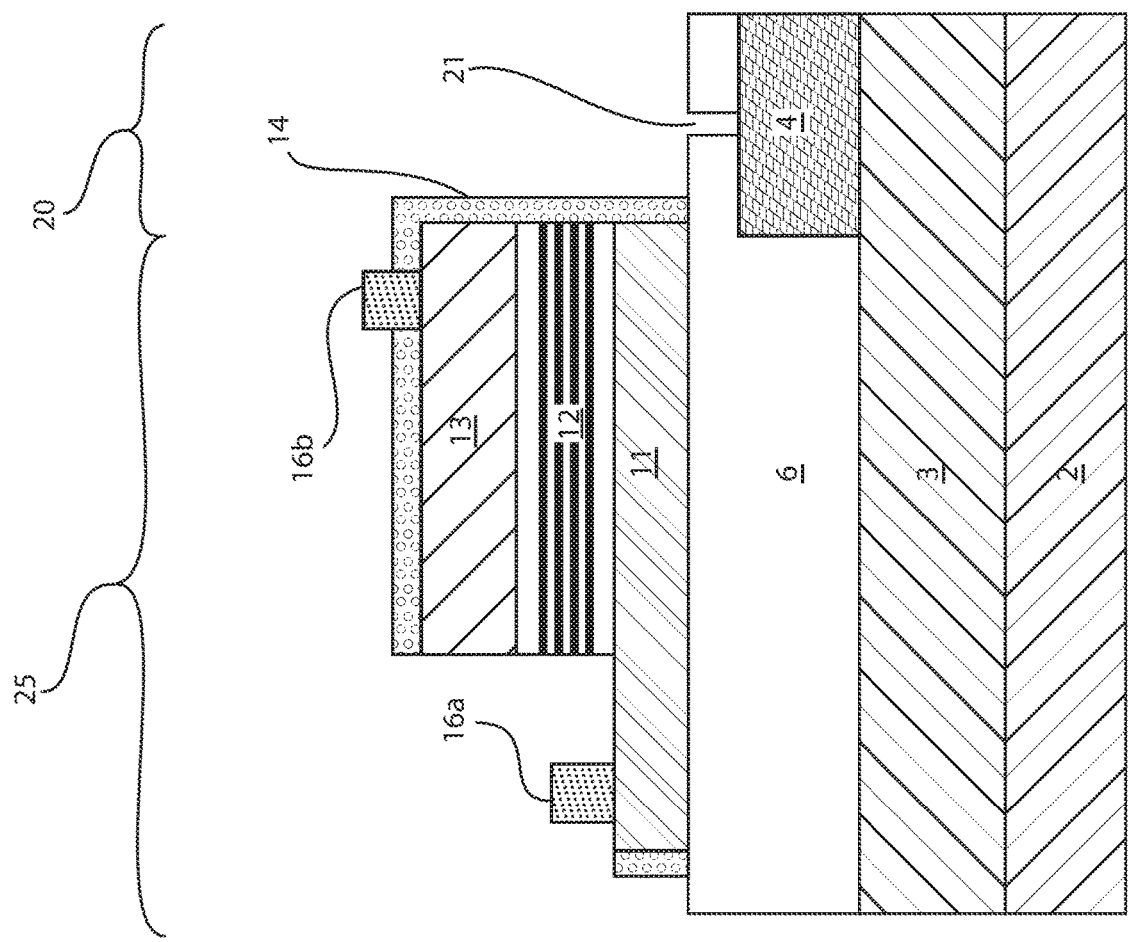
FIG. 8B
FIG. 8A

III-V PHOTONIC INTEGRATED CIRCUITS ON SILICON SUBSTRATE

BACKGROUND

Technical Field

The present disclosure relates to semiconductor devices, such as optoelectronic devices composed of III-V semiconductor materials.

Description of the Related Art

The dimensions of semiconductor field effect transistors (FETs) have been steadily shrinking over the last thirty years or so, as scaling to smaller dimensions leads to continuing device performance improvements. With increasing scaling of semiconductor devices, the interconnects have also been decreasing in size. Typically, as the interconnect size has decreased, the resistance of the interconnects has increased. With increased scaling of semiconductor devices leading to increased switching speeds, the obstruction to further performance enhancements is the speed at which data signals can be transmitted over interconnects.

SUMMARY

In one aspect, an electrical device is provided that includes a substrate structure including a semiconductor on insulator (SOI) layer that is present on a buried dielectric layer in a first portion of the substrate structure and an isolation dielectric material that is present directly on the buried dielectric layer in a second portion of the substrate structure. A III-V optoelectronic device is present in direct contact with the isolation dielectric material in a first region of the second portion of the substrate structure, and a dielectric wave guide is present in direct contact with the isolation dielectric material in a second region of the second portion of the substrate structure.

In another aspect, an electrical device is provided that includes a III-V optoelectronic device having a base III-V semiconductor material layer that is present in direct contact with an isolation dielectric material along an entirety of a width of the III-V optoelectronic device in a first region of a substrate structure, wherein the base III-V material layer has a defect density of $10^8/cm^2$ or less. The electrical device further includes a dielectric wave guide present in a second region of the substrate structure, wherein a base surface of the dielectric wave guide is in direction contact with a portion of the isolation dielectric material that extends from the first region of the substrate structure to the second region of the substrate structure, wherein the base surface of the dielectric wave guide is coplanar with a surface of the base III-V semiconductor material layer that is in direct contact with the isolation dielectric material in the first region of the substrate structure.

In another aspect, a method of forming an electrical device is provided that includes patterning a substrate structure including a semiconductor on insulator layer (SOI) layer on a buried dielectric layer to a provide first portion of the substrate structure including an island of a remaining portion of the SOI layer on a buried dielectric layer and a second portion of the substrate structure having an exposed upper surface of the buried dielectric layer. An isolation dielectric material may then be formed on first and second portions of the substrate structure. The isolation dielectric material is formed directly on an entirely of the buried dielectric layer in the second portion of the substrate structure. The isolation dielectric material is also formed overlying at least a portion the SOI layer in the first portion of the substrate structure, in which a via extends through the isolation dielectric material to expose a seed portion of the SOI layer. A first III-V semiconductor material is epitaxially formed from the seed portion of the SOI layer extending over the isolation dielectric material from the first portion of the substrate structure to the second portion of the substrate structure. A portion of the first III-V semiconductor material layer that is present in the first portion of the substrate structure including the via is then removed. At least a portion of a remaining portion of the first III-V semiconductor material layer is present in the second portion of the substrate structure. An optoelectronic device is formed on the remaining portion of the first III-V semiconductor material layer. The optoelectronic device includes at least a second III-V semiconductor material layer. A dielectric waveguide may then be formed directly on the isolation dielectric material.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 3A is a side cross-sectional view depicting patterning the SOI substrate to a provide first portion of the substrate structure including an island of a remaining portion of the SOI layer and a second portion of the substrate structure having an exposed upper surface of the buried dielectric layer, and forming an isolation dielectric material on first and second portions of the substrate structure, wherein a via extends through the isolation dielectric material to expose a seed portion of the SOI layer, in accordance with one embodiment of the present disclosure.

FIG. 3B is a top down view of the structure depicted in FIG. 3A.

FIG. 4A is a side cross-sectional view depicting epitaxially forming a first III-V semiconductor material layer from the seed portion of the SOI layer extending over the isolation dielectric material from the first portion to the second portion of the substrate structure, in accordance with one embodiment of the present disclosure.

FIG. 4B is a top down view of the structure depicted in FIG. 4A.

FIG. 5A is a side cross-sectional view depicting planarizing the first III-V semiconductor material layer, in accordance with one embodiment of the present disclosure.

FIG. 5B is a top down view of the structure depicted in FIG. 5A.

FIG. 6A is a side cross-sectional view depicting removing a portion of the first III-V semiconductor material layer that is present in the first portion of the substrate structure including the via, wherein a remaining portion of the first III-V semiconductor material layer is present in the second portion of the substrate structure, in accordance with one embodiment of the present disclosure.

FIG. 6B is a top down view of the structure depicted in FIG. 6A.

FIG. 8A is a side cross-sectional view depicting one embodiment of patterning the second III-V semiconductor material layer and the III-V semiconductor multiple quantum well layered stack to expose a portion of the first III-V semiconductor material layer, and forming contacts to exposed portions of the first III-V semiconductor material layer and the second conductivity cladding layer, in accordance with the present disclosure.

FIG. 8B is a top down view of the structure depicted in FIG. 8A.

DETAILED DESCRIPTION OF THE PREFERRED EMBODIMENTS

Figure 1B:
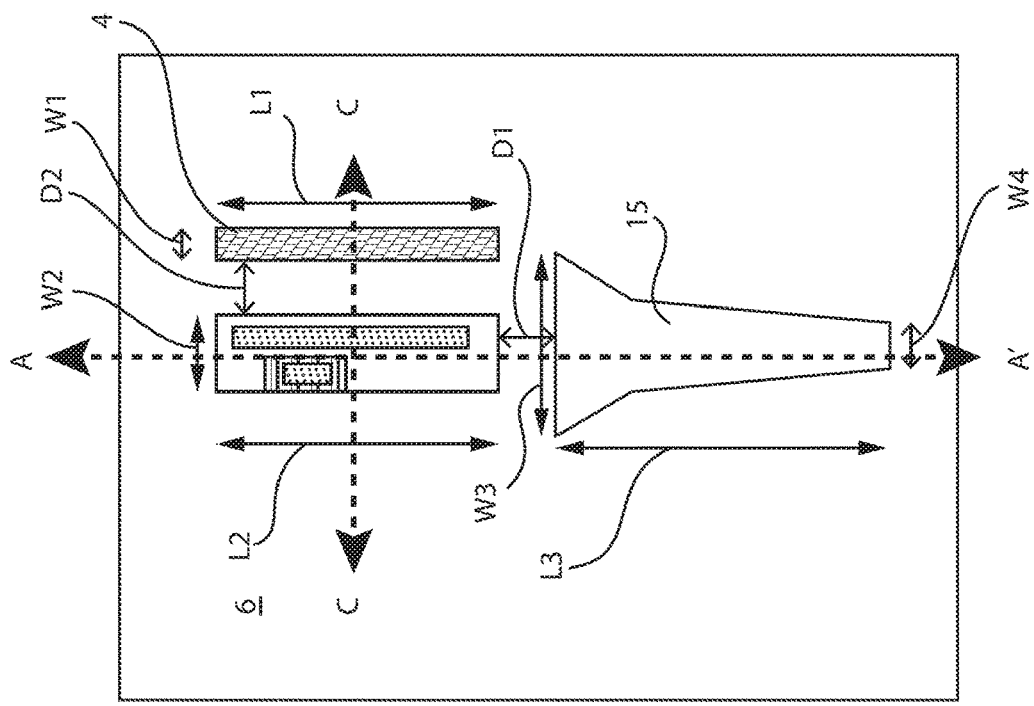
FIG. 1B is a top down view of the electrical device that is depicted in FIG. 1A.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact", "directly on" and "contacting" mean that a first element, such as a first structure, and a second element, such as a second structure, are connected without any intermediary conducting, insulating or semiconductor layers at the interface of the two elements.

In some embodiments, the methods and structures disclosed herein provide a III-V optoelectronic device having a base surface that is present directly on an isolation dielectric material, and a dielectric waveguide that is also present directly on the isolation dielectric material, wherein both the optoelectronic device and the dielectric waveguide are present on a semiconductor on insulator (SOI) substrate. As used herein, the term "optoelectronic" denotes a semiconductor light emitting structure, such as a laser diode. The laser diode is an electrically pumped semiconductor laser in which the active medium is formed by a p-n junction of a semiconductor diode similar to that found in a light-emitting diode. A laser diode is electrically a p-i-n diode. The active region of the laser diode is in the intrinsic (I) region, and the carriers, electrons and holes, are pumped into it from the N and P regions (n-type doped regions or p-type doped regions) respectively, also referred to herein as the first III-V semiconductor material layer and second III-V semiconductor material layer.

In some embodiments, the optoelectronic device may be a quantum well laser. A quantum well laser is a laser diode in which the active region of the device is so narrow that quantum confinement occurs. If the middle layer, i.e., active region, of the laser is made thin enough, it acts as a quantum well. This means that the vertical variation of the electron's wavefunction, and thus a component of its energy, is quantized. The term "quantum well" or "QW" used herein refers to a thin-layer structure comprising alternate layers consisting of a first semiconductor layer with a thickness smaller than the de Broglie wavelength of about 200 Å to 300 Å with respect to electrons or holes, and at least a second semiconductor layer with a band gap greater than that of the first semiconductor layer. The term "band gap" refers to the energy difference between the top of the valance band (i.e., Ev) and the bottom of the conduction band (i.e., Ec). A QW structure can be formed by sandwiching a semiconductor thin layer of a narrow band gap between semiconductor layers of a large band gap. Lasers containing more than one quantum well layer are known as multiple quantum well lasers.

If a single semiconductor thin layer constitutes a quantum well for both electrons and holes, the quantum well is called a type I quantum well. In this case, the semiconductor layer of a narrow band gap is called a well layer, and the semiconductor layers of a large band gap are called barrier layers. A type I multi-quantum well structure can be formed by alternately laminating semiconductor layers of narrow and broad band gaps. A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers. Optoelectronic devices including both type I and type II quantum wells are within the scope of the present disclosure.

The term "waveguide" as used herein, denotes a structure that receives light signals from the optoelectronic device, e.g., laser, and directs the light signal to another structure, such as an electrical device, e.g., waveguide to another semiconductor device. Examples of materials that are suitable for the dielectric waveguide include, without limitation, silicon oxides (e.g., doped or undoped silicon dioxide, $SiO_2$), silicon nitride, silicon oxynitride, silicon carbide, hafnium oxide, aluminum oxide, and silica. Further details regarding the optoelectronic devices and waveguides are now described with reference to FIGS. 1A-9B.

Figure 1A:
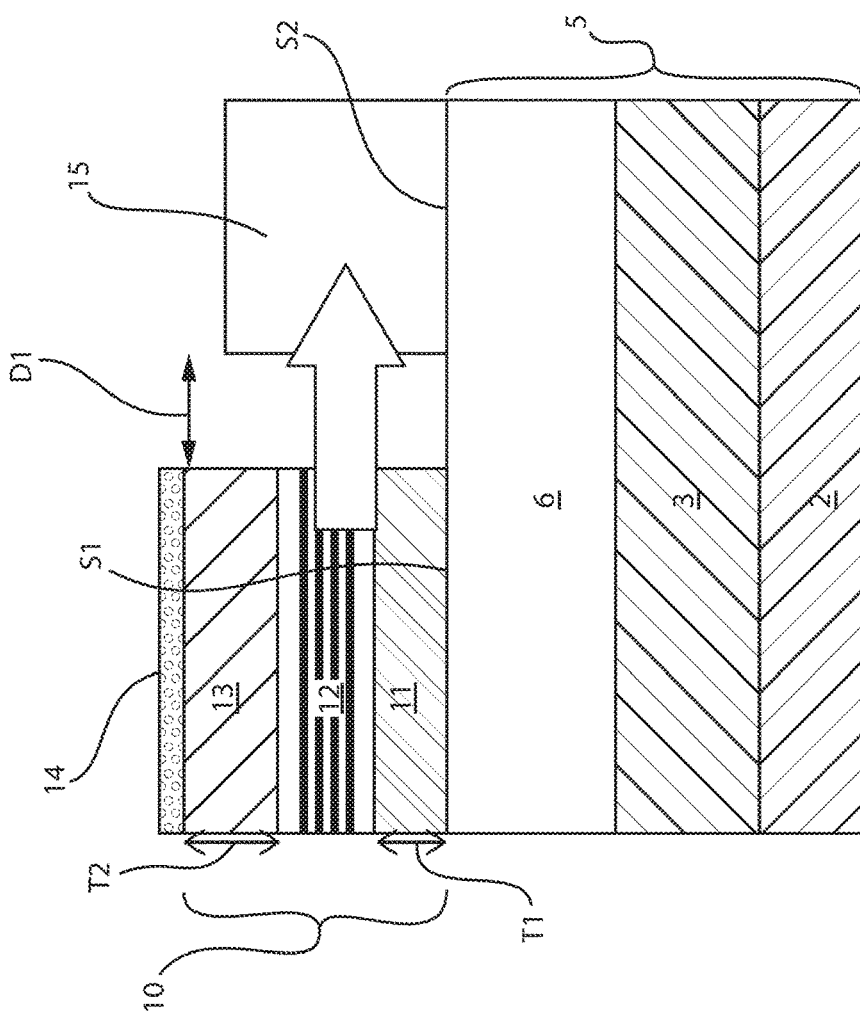
FIG. 1A is a side cross sectional view depicting one embodiment of an electrical device including a III-V optoelectronic device and a dielectric wave guide, in accordance with the present disclosure.
Figure 1C:
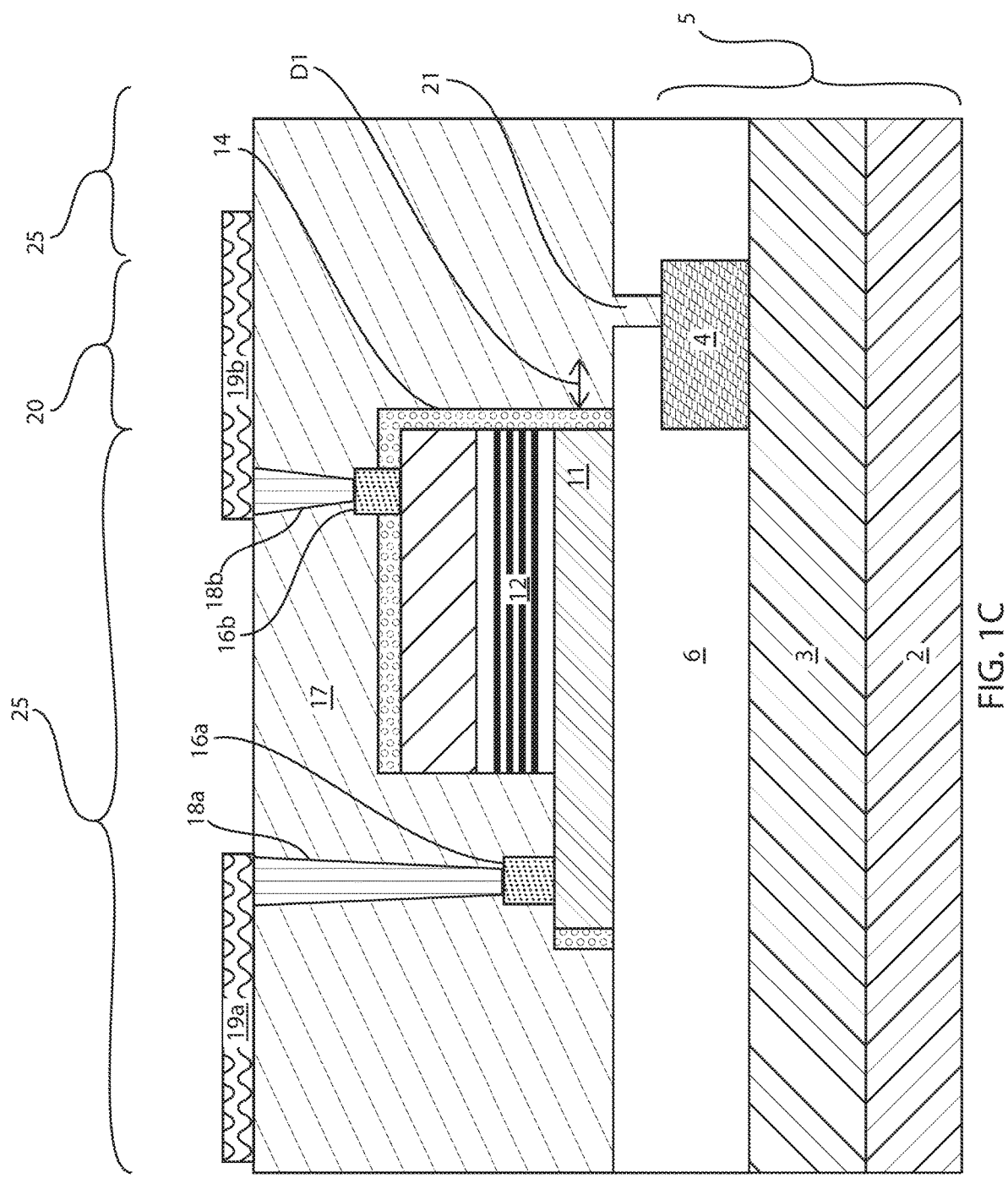
FIG. 1C is a side cross-sectional view along section line C-C of FIG. 1B.

FIGS. 1A-1C depict one embodiment of an electrical device that includes a substrate structure (hereafter referred to as semiconductor on insulator (SOI) substrate 5), including a semiconductor on insulator (SOI) layer 4 that is present on a buried dielectric layer 3 in a first portion 20 of the SOI substrate 5, and an isolation dielectric material 6 that is present directly on the buried dielectric layer 3 in a second portion 25 of the SOI substrate 5. The SOI substrate 5 typically includes a base semiconductor layer 2, the buried dielectric layer 3 and the SOI layer 4.

The SOI layer 4 of the SOI substrate 5 may be composed of any silicon including material, such as silicon, monocrystalline silicon, polycrystalline silicon, silicon germanium, monocrystalline silicon germanium, polycrystalline silicon germanium, silicon doped with carbon (Si:C), silicon carbide, silicon germanium doped with carbon (SiGe:C) and combinations thereof. The SOI layer 4 may have a thickness ranging from 10 nm to 250 nm, wherein in some embodiment in which the SOI layer 4 is an extremely thin SOI layer (ETSOI layer) the thickness of the SOI layer 4 may be less than 10 nm. The buried dielectric layer 3 may be composed of any oxide, nitride or oxynitride dielectric material. For example, when the buried dielectric layer 3 is an oxide, the buried dielectric layer 3 may be composed of silicon oxide. In another example, when the buried dielectric layer 3 is a nitride, the buried dielectric layer 3 may be silicon nitride. The thickness of the buried dielectric layer 3 may range from 10 nm to 250 nm. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer 2 may have the same or a different composition than the SOI layer 4.

The first portion 20 of the SOI substrate 5 contains a remaining portion of the semiconductor on insulator (SOI) layer that is present directly on the buried dielectric layer 3. The remaining portion of the SOI layer may be referred to as an island of SOI layer material. The first portion 20 of the SOI substrate 5 includes a portion of the isolation dielectric material 6 that extends over at least a portion of the upper surface of the remaining portion of the SOI layer 4. Referring to FIG. 1B, the remaining portion of the SOI layer 4 has a length L1 ranging from 30 microns to 3000 microns, and a width W1 ranging from 0.02 microns to 0.2 microns. In another embodiment, the remaining portion of the SOI layer 4 has a length L1 ranging from 30 microns to 3000 microns, and a width W1 ranging from 0.02 microns to 0.2 microns.

In some embodiments, a via 21 is present extending through the portion of the isolation dielectric material 6 that is present atop the remaining portion of the SOI layer 4. The via 21 may have a width W1 ranging from 0.02 microns to 0.2 microns. As will be described in further detail below the portion of the SOI layer 4 that is present within the via provides the seed surface for epitaxial growth of the compound III-V semiconductor material that provides the base surface layer of the photoelectronic device 10 that is present in the second portion 25 of the SOI substrate 5.

The second portion 25 of the SOI substrate 5 is the portion of the SOI structure 5 that the SOI layer 4 has been removed from. In the second portion 25 of the SOI substrate 5 the isolation dielectric material 6 is present in direct contact with an upper surface of the buried dielectric layer 3. The isolation dielectric material 6 may be composed of any dielectric material. For example, the isolation dielectric material 6 may composed of an oxide, such as silicon oxide ($SiO_2$). In another example, the isolation dielectric material 6 may be composed of a nitride, such as silicon nitride. It is noted that the above examples are provided for illustrative purposes only, and that other dielectric compositions may be suitable for the isolation dielectric material 6. For example, the isolation dielectric material 6 may be composed of a high-k dielectric material. As used herein, "high-k" denotes a dielectric material featuring a dielectric constant (k) higher than the dielectric constant of $SiO_2$ at room temperature, e.g., 20° C. to 25° C., and atmospheric pressure, e.g., 1 atm. Examples of high-k dielectrics that can be used for the isolation dielectric material 6 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed for the isolation dielectric material 6 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_2O_3$), lanthanum aluminate ($LaAlO_3$), and zirconium silicate ($ZrSiO_x$). In yet other embodiments, the dielectric material of the isolation dielectric material 6 may be a low-k dielectric material. A "low-k dielectric material" is a dielectric material featuring a dielectric constant (k) higher equal to or less than the dielectric constant of silicon oxide ($SiO_2$) at room temperature, e.g., 20° C. to 25° C., and atmospheric pressure, e.g., 1 atm. For example, the dielectric constant of a low-k dielectric material may range from 1.75 to 3.5. Examples of low-k dielectric materials suitable for the isolation dielectric 6 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

It is noted that the above materials for the isolation dielectric material 6 are only illustrative of some embodiments, as any dielectric material is suitable for the isolation dielectric material 6, so long as the isolation dielectric material 6 can withstand the processing required to provide the optoelectronic device 10 and the dielectric waveguide 15.

Referring to FIGS. 1A-1C, a III-V optoelectronic device 10 is present in direct contact with the isolation dielectric material 6 in a first region of the second portion 25 of the SOI substrate 5, and a dielectric wave guide 15 is present in direct contact with the isolation dielectric material 6 in a second region of the second portion 25 of the SOI substrate 5. The III-V optoelectronic device 10 is typically a laser diode composed of III-V compound semiconductors. As used herein, the term "III-V compound semiconductor" denotes a semiconductor material that includes at least one element from Group III of the Periodic Table of Elements (Group 13 in accordance with the IUPAC system), and at least one element from Group V of the Periodic Table of Elements (Group 15 in accordance with the IUPAC system).

Examples of III-V compound semiconductor materials that can be employed in the material layers of the optoelectronic device 10 include (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Laser diodes are formed in compound semiconductor materials, such as III-V semiconductor materials, that are able to emit light. In one embodiment, the laser diode that provides the optoelectronic device 10 includes a first III-V semiconductor material layer 11 that is present directly on isolation dielectric material 6, a stacked structure of quantum wells 12 comprising III-V semiconductor material layer that is present on the first III-V semiconductor material layer 11, and a second III-V semiconductor material layer 13 that is present on the stacked structure of quantum wells 12, as depicted in FIGS. 1A-1C. The first III-V semiconductor material layer 11 may be referred to as the base III-V material layer of the III-V optoelectronic device 10. FIG. 1A is a side cross-sectional view of the electrical device along section line A-A in FIG. 1B. FIG. 1C is a side cross-sectional view of the electrical device along section line C-D in FIG. 1B. The optoelectronic device 10 depicted in FIGS. 1A-1C is a quantum well laser, in which the wavelength of the light emitted by the quantum well laser is determined by the width of the active region rather than just the bandgap of the material from which it is constructed. The first and second III-V semiconductor material layers 11, 13, which may also be referred to as cladding layers, typically are doped to a first conductivity type and a second conductivity type. The term "conductivity type" denotes that the material layer has been doped to be p-type or n-type. For example, the first III-V semiconductor material layer 11 may be doped to a first conductivity, e.g., n-type conductivity, and the second III-V semiconductor material layer 13 may be doped to a second conductivity, e.g., p-type conductivity.

In some embodiments, the first and second III-V semiconductor material layers 11, 13 function to pump charge carriers, i.e., electron and hole charge carriers, into the intrinsic active area provided by the quantum well. In some examples, the first III-V semiconductor material layer 11 may be composed of InP or GaAs or AlGaAs or InAlAs. The dopant that provides the conductivity type, i.e., first type conductivity, e.g., n-type, of the first III-V semiconductor material layer 11 may be present in a concentration ranging from $10^{17}$ atoms/cm$^3$ to $10^{20}$ atoms/cm$^3$. In some examples, the first III-V semiconductor material layer 11 may have a thickness T1 ranging from 100 nm to 2000 nm. In some embodiments, the second III-V semiconductor material layer 13 may be composed of InP or GaAs or AlGaAs or InAlAs. The dopant that provides the conductivity type, i.e., second type conductivity, e.g., p-type, of the second III-V semiconductor material layer 13 may be present in a concentration ranging from $10^{17}$ atoms/cm$^3$ to $10^{20}$ atoms/cm$^3$. In some examples, the second III-V semiconductor material layer 13 may have a thickness T2 ranging from 100 nm to 2000 nm. It is noted that the above compositions and thicknesses are provided for illustrative purposes only, and are not intended to limit the present disclosure. For example, the first and second III-V semiconductor material layers 11, 13 may be composed of any III-V compound semiconductor composition provided above.

The active region of the laser diode is in the intrinsic (I) region. By "intrinsic" it is meant that the region is not doped with an extrinsic dopant, e.g., n-type or p-type dopant, such as the dopants used to dope the first and second III-V semiconductor material layers 11, 13. The active region in the quantum well structure 12 is formed by alternating layers of relatively low bandgap material and layers of relatively high bandgap material. As used herein, a "low bandgap" is a bandgap ranges from 0.5 eV to 3.0 eV, and a "high bandgap" ranges from 1.0 eV to 3.5 eV. The former layers are termed "well layers" and the latter layers are termed "barrier layers." For example, the active low bandgap layers comprised $Al_rGa_{1-r}As$ and the passive high bandgap layers comprised $Al_zGa_{1-z}As$ with r<z.

To provide the stacked structure of quantum wells 12, the thickness of each layer of III-V compound semiconductor material within the quantum well 12 may be no greater than 50 nm. For example, the thickness for each layer of the III-V compound semiconductor material within the quantum well 12 may range from 5 nm to 10 nm. In some embodiments, the stacked structure of quantum wells 12 may be composed of 1 to 100 layers of semiconductor material, such as III-V compound semiconductor material. In yet another embodiment, the stacked structure of quantum wells 12 may be composed of 1 to 5 layers of semiconductor material. In some embodiments, the quantum well (QW) layers and barrier layers of the quantum well structure 12 are formed of a semiconductor material, such as $In_xGa_{1-x}As_yP_{1-y}$, $In_xGa_{1-x}As$, $In_xGa_{1-x}N_yAs_{1-y}$, $In_xGa_{1-x}As_ySb$ (here, 0.0<x<1.0, 0.0<y<1.0).

In one embodiment, an electrical device is provided that includes a III-V optoelectronic device 10, e.g., the laser diode composed of III-V compound semiconductors that is described above, in which the base III-V material layer, e.g., first III-V semiconductor material layer 11, is present in direct contact with the isolation dielectric material 6 along an entirety of a width of the III-V optoelectronic device 10 in a first region of the SOI substrate 5, wherein the first III-V semiconductor material layer 11 has a defect density of $10^8$ defects/cm$^3$ or less. In some embodiments, the defect density of the first III-V semiconductor material layer 11 may range from $10^5$ defects/cm$^3$ to $10^7$ defects/cm$^3$.

Referring to FIG. 1C, in some embodiments, the optoelectronic device 10 may include a first contact 16a to the first III-V semiconductor material layer 11, and a second contact 16B to the second III-V semiconductor material layer 13. The first and second contact 16A, 16b are composed of a metal containing material, such as an elemental metal, e.g., copper, aluminum, platinum, and alloys thereof, or a metal semiconductor alloy. In some embodiments, at least one of the first and second contact 16a, 16b may extend through a passivation dielectric layer 14 that is present on at least a portion of the optoelectronic device 10. The passivation dielectric layer 14 may be composed of an oxide, such as silicon oxide; nitride, such as silicon nitride; and/or a silicon oxynitride. The thickness of the passivation dielectric layer 14 may range from 5 nm to 100 nm.

Referring to FIG. 1B, the optoelectronic device 10 may have a width W1 ranging from 3 microns to 5 microns. The width W1 dimension of the optoelectronic device 10 is along a dimension perpendicular to the direction along which the optoelectronic device 10 emits a beam of light. In some embodiments, the width W1 may range from 3.75 microns to 4.25 microns, and in one example is equal to 4 microns. The length L2 of the optoelectronic device 10 may range from approximately 50 microns to approximately 100 microns. In one example, the length L2 of the optoelectronic device 10 may be approximately 80 microns.

The electrical device further includes a dielectric wave guide 15 present in a second region of the substrate structure, e.g., SOI substrate 5. Typically, the function of the dielectric wave guide 15 is to receive the beam of light being emitted from the optoelectronic device 10 and to transmit that beam of light to another portion of the SOI substrate 5. For example, the beam of light may be transmitted to a second device on a second portion of the substrate, such as a logic device, e.g., field effect transistor (FET), or a memory device, e.g., DRAM, FLASH or EDRAM memory device.

In some embodiments, the dielectric wave guide 15 is composed of a dielectric material that is selected from the group consisting of silicon oxide, silicon nitride, silicon oxynitride, silicon carbide, hafnium oxide, aluminum oxide, aluminum nitride, amorphous silicon, silica and combinations thereof. The dielectric wave guide 15 typically has a tapered geometry. By "tapered" it is meant that the width of the dielectric wave guide 15 it is meant that the width of the dielectric wave guide 15 decreases along one direction from a first end of the dielectric wave guide 15 to a second end of the dielectric wave guide 15. For example, in some embodiments, the face of the dielectric wave guide 15 that is proximate to, and receives the light from the optoelectronic device 10, is typically greater in width W3 than the width W4 of the face of the dielectric wave guide 15 that transmits the light to another portion of the SOI substrate 5. The width of the dielectric wave 15 guide may taper gradually at a consistent rate, or the taper of the dielectric wave guide 15 may have regions in which the rate that the width of the dielectric wave guide 15 decreases is greater than the taper in other portions of the dielectric wave guide 15. In one example, the width W3 of the face of the dielectric wave guide 15 that receives the light beam from the optoelectronic device 10 may range from 4 microns to 16 microns. In another embodiment, the width W3 of the face of the dielectric wave guide 15 ranges from 6 microns to 10 microns, e.g., the width W3 of the face of the dielectric wave guide 15 may be 8 microns. In one example, the width W4 of the face of the dielectric wave guide 15 that emits the light beam may range from 8 microns to 1 micron. In another example, the width W4 of the face of the dielectric wave guide 15 ranges from 5 microns to 1 micron.

In some embodiments, a base surface of the dielectric wave guide 15 is in direction contact with a portion of the isolation dielectric material 6 that extends from the first region of the second portion 25 of the SOI substrate 5 to the second region of within the second portion 25 of the SOI substrate 5. The base surface 51 of the dielectric wave guide 15 is coplanar with a base surface S2 of the base III-V material layer, i.e., first III-V semiconductor material layer 11 of the optoelectronic device 10, which is in direct contact with the isolation dielectric material 6 in the first region of the SOI substrate 5. In some embodiments, the upper surface 51 of the optoelectronic device Referring to FIG. 1B, the dielectric wave guide 15 is positioned to have a length L3 along the direction that light is being emitted from the optoelectronic device 10. In this manner, the dielectric wave guide 15 is substantially aligned with the light being emitted from the optoelectronic device 10. The length L3 of the dielectric wave guide 15 may range from 50 microns to 100 microns. In some embodiments, the length L3 of the dielectric wave guide 15 may range from 60 microns to 90 microns. For example, the length L3 of the dielectric wave guide 15 may be 80 microns. The distance D2 separating the optoelectronic device 10 from the dielectric wave guide 15 may range from 100 nm to 300 nm. In some embodiments, the distance D2 separating the optoelectronic device 10 from the dielectric wave guide 14 may range from 150 nm to 250 nm. In one example, the distance D2 separating the optoelectronic device 10 from the dielectric wave guide 15 is equal to 200 nm.

Referring to FIGS. 1B and 1C, the III-V optoelectronic device 10 and the dielectric wave guide 15 are substantially aligned along a first plane on the second portion of the SOI substrate 5, and the first portion of the substrate including the semiconductor material layer, i.e., remaining portion of the SOI layer 4, is offset from the first plane. Referring to FIG. 1C, the portion of the SOI layer 4 that is exposed by the via 21 may be separated from the sidewall of the optoelectronic device 10 by a dimension D1 ranging from 0.02 microns to 0.2 microns. In another embodiment, the portion of the SOI layer 4 that is exposed by the via 21 may be separated from the sidewall of the optoelectronic device 10 by a dimension ranging from 0.02 microns to 0.1 microns. As depicted in FIG. 1C, although a portion of the remaining portion of the SOI layer 4 may extend beneath the optoelectronic device 10, the optoelectronic device 10 and the remaining portion of the SOI layer 4 may be separated by the isolation dielectric material 6 that extends from the first portion 20 of the SOI substrate 5 to the second portion 25 of the SOI substrate 5.

It is noted that the above structural and compositional limitations are provided for illustrative purposes only, and are not intended to limit the present disclosure to only the above described examples. The structures and methods of the present disclosure, are now described in more detail with reference to FIGS. 2 to 9B.

Figure 2:
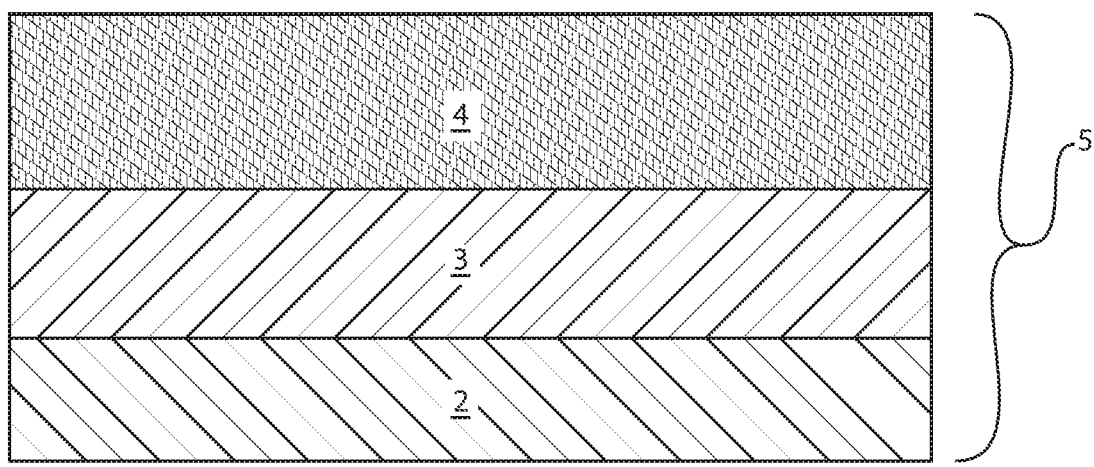
FIG. 2 is a side cross-sectional view of one embodiment of a semiconductor on insulator (SOI) substrate, as used in one embodiment of a method for forming an electrical device including a III-V optoelectronic device and a dielectric wave guide, in accordance with the present disclosure.

FIG. 2 depicts one embodiment of a semiconductor on insulator (SOI) substrate 5, as used in one embodiment of a method for forming an electrical device including a III-V optoelectronic device 10 and a dielectric wave guide 15. The SOI substrate 5 includes an SOI layer 4, buried dielectric layer 3, and base semiconductor layer 3, as described above with reference to FIGS. 1A-1C. The SOI substrate 5 may be formed by a thermal bonding process, or alternatively, the SOI substrate 5 may be formed by an oxygen implantation process, which is referred to in the art as a separation by implantation of oxygen (SIMOX). In other embodiments, deposition may be used to form the buried dielectric layer 3 on a bulk semiconductor substrate, in which the bulk semiconductor substrate provides the base semiconductor substrate 2. In this embodiment, the SOI layer 4 may then be deposited on the buried dielectric layer 3 to provide the SOI substrate 5.

FIGS. 3A and 3B depict one embodiment of patterning the SOI substrate 5 to a provide first portion 20 of the SOI substrate 5 including an island of a remaining portion of the SOI layer 4 and a second portion 25 of the SOI substrate 5 having an exposed upper surface of the buried dielectric layer 3. Patterning the SOI substrate 5 may include deposition, photolithography and etch processes. Specifically, in one example, a photoresist mask (not shown) is formed overlying the SOI layer 4 of the SOI substrate 5, in which the portion of the SOI layer 4 that is underlying the photoresist mask provides the remaining portion of the SOI layer 4 that is present in the first portion 20 of the SOI substrate 5. The exposed portions of the SOI layer 5, which are not protected by the photoresist mask, are removed using a selective etch process. To provide the photoresist mask, a photoresist layer is first positioned on the SOI layer 5. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the SOI layer. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

FIGS. 3A and 3B also depict one embodiment of forming an isolation dielectric material 6 on first and second portions 20, 25 of the SOI substrate 5, wherein a via 21 extends through the isolation dielectric material 6 to expose a seed portion of the SOI layer 4. The isolation dielectric material 6 may be formed using a deposition process. For example, the isolation dielectric material 6 may be deposited using chemical vapor deposition (CVD). Chemical vapor deposition (CVD) is a deposition process in which a deposited species is formed as a result of chemical reaction between gaseous reactants at greater than room temperature (25° C. to 900° C.), wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The isolation dielectric material 6 may also be deposited using chemical solution deposition, spin or deposition, or in some cases may be formed using thermal growth processes, such as thermal oxidation, nitridation or a combination thereof.

Following formation of the isolation dielectric material 6, the via 21 may be formed through the isolation dielectric material 6 to expose the seed portion of the SOI layer 4. For example, the via 21 may be formed using deposition, photolithography and etch processes similar to the above described process sequence for etching the SOI layer 4. More specifically, an etch mask, i.e., photoresist mask, is formed exposing the portion of the isolation dielectric material 6 that is etched to expose the underlying SOI layer 4. Thereafter, an etch process etches the portion of the isolation dielectric material 6 selectively to at least the SOI layer 4 and the etch mask. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material, i.e., dielectric material 6, selectively to a second material, i.e., SOI layer 4, by a ratio of 100:1 or greater. The etch process may be an anisotropic etch process, such as reactive ion etch (RIE), or any of the above described anisotropic etch processes described above for etching the SOI layer 4.

FIGS. 4A and 4B depict epitaxially forming a first III-V material 11A from the seed portion of the SOI layer 4 extending over the dielectric material 6 from the first portion 20 to the second portion 25 of the SOI substrate 5. The term "epitaxial material" denotes a semiconductor material that has been formed using an epitaxial growth and/or epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking.

The first III-V semiconductor material 11A is typically doped to a first conductivity type. For example, the first III-V semiconductor material 11A may be doped to an n-type conductivity. In other examples, the first III-V semiconductor material 11A may be doped to a p-type conductivity. The dopant may be introduced via ion implantation or via in situ implantation. The effect of the dopant atom, i.e., whether it is a p-type or n-type dopant, depends occupied by the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

The first III-V semiconductor material 11A is grown filling the via 21, and extends over the isolation dielectric material 6 onto the second portion 25 of the SOI substrate 5. The portion of the first III-V semiconductor material 11A that is present in the via 21 typically has a high defect density. The defects are pictorially represented in the supplied figures, as identified by reference number 22. For example, the defect density of the first III-V semiconductor material 11A may range from $10^7$ defects/$cm^3$ to $10^{11}$ defects/cm$^3$. In another example, the defect density of the first III-V semiconductor material 11A may range from 10$^9$ defects/cm$^3$ to 10$^{10}$ defects/cm$^3$. The high defect density may be contained within the via 21 in accordance with the principles of high aspect ratio defect trapping. More specifically, the high defect density of the portion of the first III-V semiconductor material layer 11A having a high defect density may be contained within the via 21 having an aspect ratio (i.e., height to width ratio) being greater than 1:1, e.g., greater than 10:1. The defect density within the first III-V semiconductor material 11A reduces along the distance D3 away from the via 21 to the seed portion 25 of the SOI substrate 5. For example, at a distance D3 of 100 nm from the sidewall of the via 21, the defect density within the first III-V semiconductor material 11A may be reduced to 10$^6$ defects/cm$^3$. In another example, at a distance D3 of 50 nm from the sidewall of the via 21, the defect density within the first III-V semiconductor material 11A may be reduced to 10$^6$ defects/cm$^3$. Typically, the farther away from the via 21, the lower the defect density in the first III-V semiconductor material layer 11A.

FIGS. 5A and 5B depict planarizing the first III-V semiconductor material 11A depicted in FIGS. 4A and 4B. Planarization may include chemical mechanical planarization (CMP) or grinding.

FIGS. 6A and 6B depicting removing a portion of the first III-V semiconductor material layer 11 that is present in the first portion 20 of the SOI substrate 5 including the via 21, wherein a remaining portion of the first III-V semiconductor material layer 11 is present in the second portion 25 of the SOI substrate 5. The portion of the first III-V semiconductor material layer 11 that is removed from the first portion 20 of the SOI substrate 5 is removed using deposition, photolithography and etch processes. For example, a photoresist mask may be formed on the portion of the first III-V semiconductor material layer 11 that is present in the second portion 25 of the SOI substrate 5, and the exposed portions of the first III-V semiconductor material layer 11 are removed using a selective etch process. For example, the etch process for removing the first III-V material layer 11 may be an anisotropic etch, such as RIE, or an isotropic etch, such as a wet chemical etch. The etch process depicted in FIGS. 6A and 6B provide the width and length dimensions of the optoelectronic device that is formed to include the first III-V semiconductor material layer 11. The etch process removes the high defect portion of the first III-V semiconductor material layer 11. Before the following described epitaxial growth of III-V semiconductor materials, the seed portion of the SOI layer can be covered with dielectric films defined by lithography.

Figure 7B:
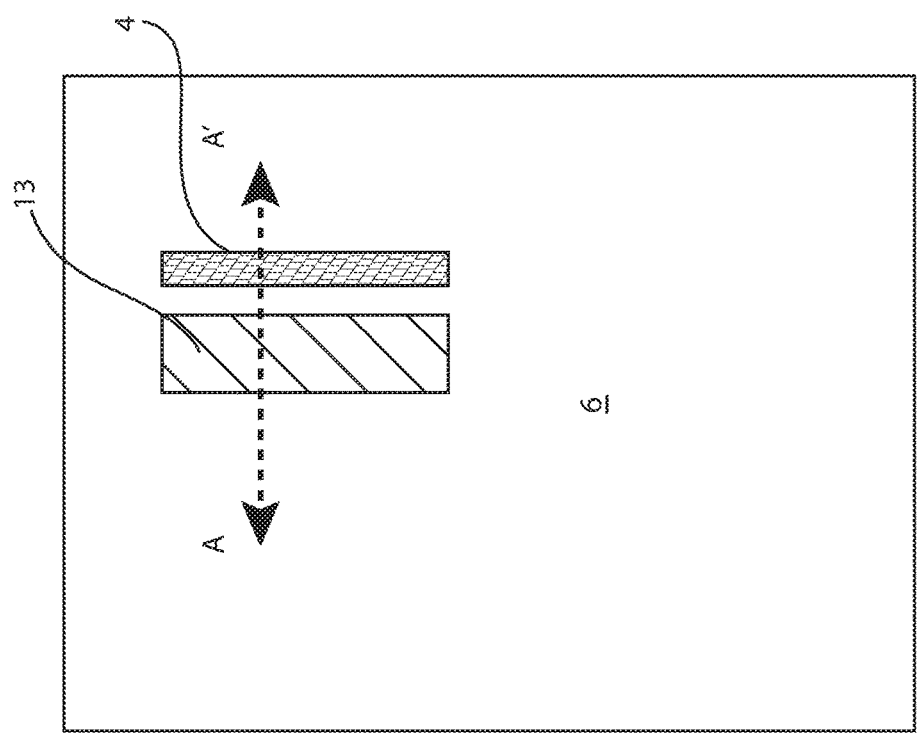
FIG. 7B is a top down view of the structure depicted in FIG. 7A.
Figure 7A:
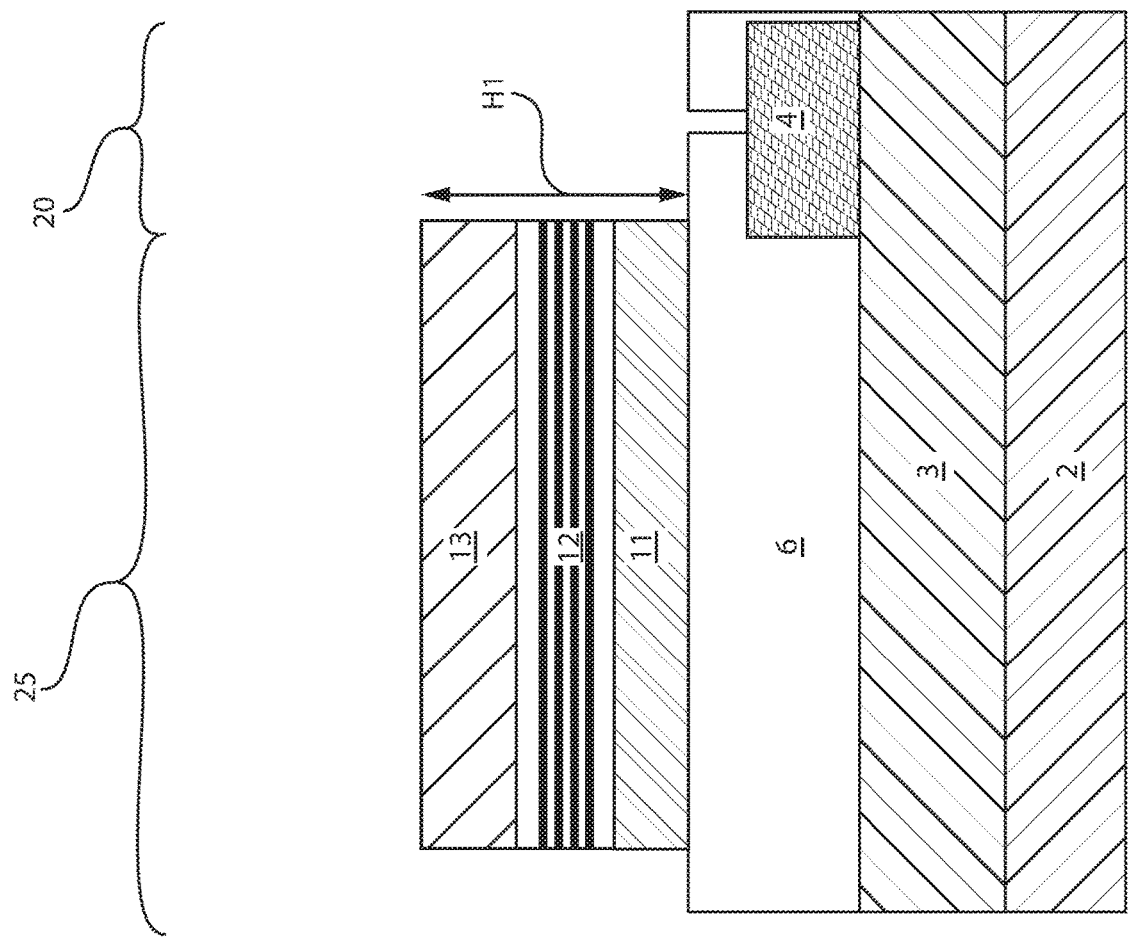
FIG. 7A is a side cross-sectional view of forming a III-V semiconductor multiple quantum well layered stack on the remaining portion of the first III-V semiconductor material layer; and forming a second III-V semiconductor material layer on the III-V semiconductor multiple quantum well layer, in accordance with one embodiment of the present disclosure.

FIGS. 7A and 7B depict one embodiment of forming a III-V multiple quantum well layered stack 12 on the remaining portion of the first III-V semiconductor material layer 11 that provides a first conductivity cladding layer. The III-V multiple quantum well layered stack 12 is typically a layered stack of intrinsic semiconductor materials. Each material layer of the III-V multiple quantum well layered stack 12 can be formed using an epitaxial deposition process, which may be carried out in the deposition chamber of a CVD apparatus. The epitaxial deposition process for forming the first III-V semiconductor material layer 11 may be a selective epitaxial deposition process. The fact that the process is selective means that the III-V semiconductor material only on forms on the exposed semiconductor surfaces, such as the upper surface of the first III-V semiconductor material layer 11, and is not formed on dielectric surfaces, such as the surface of the isolation dielectric material 6. The different compositions of the III-V multiple quantum well layered stack 12 may be provided by changing and cycling the precursor gasses used in depositing the different compositions of the III-V compound semiconductor materials for the different layers within the III-V multiple quantum well layered stack 12.

FIGS. 7A and 7B also depict one embodiment of forming a second III-V semiconductor material layer 13, also referred to as second conductivity cladding layer, on the III-V multiple quantum well layered stack 12. The second III-V semiconductor material layer 13 is typically formed having a conductivity type, e.g., second conductivity, that is opposite the conductivity type of the first III-V semiconductor material layer 11. For example, when the first III-V semiconductor material layer 11 has an n-type conductivity, the second III-V semiconductor material layer 13 has a p-type conductivity. The second III-V semiconductor material layer 13 is typically formed using an epitaxial deposition process that is similar to the process described above for forming the III-V multiple quantum well layered stack 12, and the first III-V semiconductor material layer 11. For example, the second III-V semiconductor material layer 13 is typically formed using an epitaxial deposition process that selectively forms III-V semiconductor material on semiconductor surfaces, and does not forms III-V semiconductor material on dielectric surfaces. The dopant of the second III-V semiconductor material layer 13 may be introduced in-situ or may be ion implanted into the second III-V semiconductor material layer 13.

Following formation of the second III-V semiconductor material layer 13, the height HI of the stack of the first III-V semiconductor material layer 11, the III-V multiple quantum well layered stack 12 and the second III-V semiconductor material layer 13 may range from 50 nm to 3000 nm. In another embodiment, the height HI of the stack of the first III-V semiconductor material layer 11, the III-V multiple quantum well layered stack 12 and the second III-V semiconductor material layer 13 may range from 500 nm to 1500 nm.

In some embodiments, the active portions of the optoelectronic device 10 are provided by the stack of the first III-V semiconductor material layer 11, the III-V multiple quantum well layered stack 12 and the second III-V semiconductor material layer 13. It is noted that the height HI of the stack of the first III-V semiconductor material layer 11, the III-V multiple quantum well layered stack 12 and the second III-V semiconductor material layer 13 is generally equal to the height of the optoelectronic device 10.

Referring to FIGS. 8A and 8B, a passivation dielectric layer 14 may then be formed on the sidewalls and upper surface of the optoelectronic device 10 that is provided by the stack of the first III-V semiconductor material layer 11, the III-V multiple quantum well layered stack 12 and the second III-V semiconductor material layer 13. The passivation dielectric layer 14 may be formed using a conformal deposition process. The term "conformal" denotes a layer having a thickness that does not deviate from greater than or less than 30% of an average value for the thickness of the layer. The passivation dielectric layer 14 may be formed using a deposition, e.g., chemical vapor deposition, or growth process, e.g., thermal oxidation.

FIGS. 8A and 8B also depict one embodiment of patterning the passivation dielectric layer 14, the second III-V semiconductor material layer 13 (also referred to as the second conductivity cladding layer) and the III-V multiple quantum well layered stack 12 to expose a portion of the first III-V semiconductor material layer 11 (also referred to as the first conductivity cladding layer). Patterning the layered stack may include photolithography and etch processes, similar to those described above for patterning the first III-V semiconductor material layer 11. The passivation dielectric layer 14 may also be patterned to provide an opening to the upper surface of the first III-V semiconductor material layer 11.

FIGS. 8A and 8B also depict one embodiment of forming contacts 16a, 16b to exposed portions of the first III-V semiconductor material layer 11 and the second III-V semiconductor material layer 13. The contacts 16a, 16b may be composed of a metal, which can be deposited using a physical vapor deposition (PVD) method, such as a sputtering or plating.

Figure 9B:
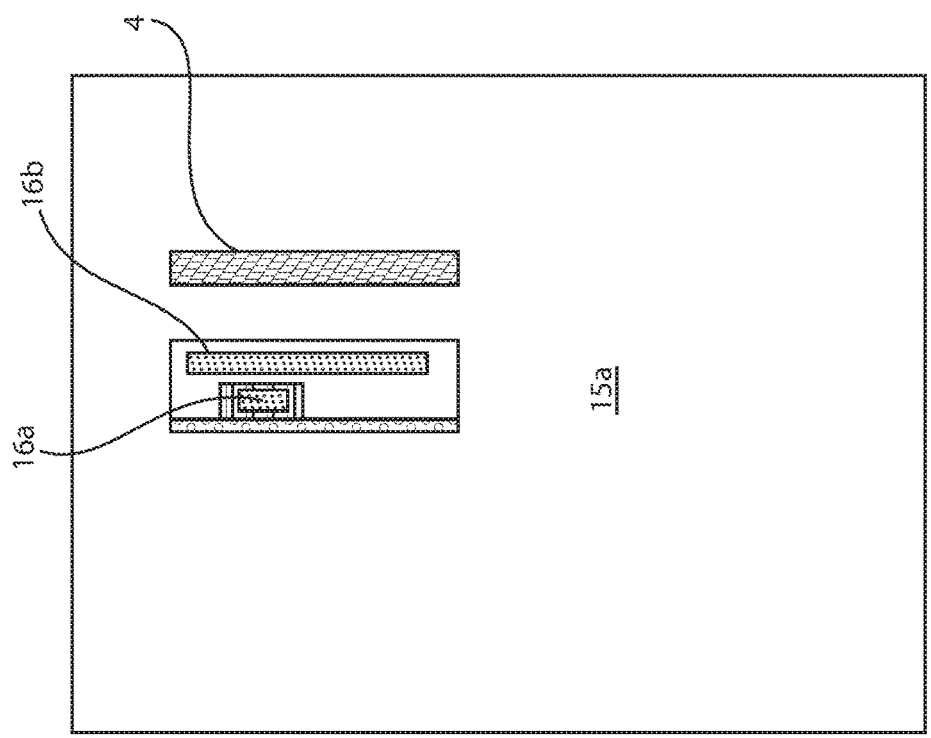
FIG. 9B is a top down view of the structure depicted in FIG. 9A.
Figure 9A:
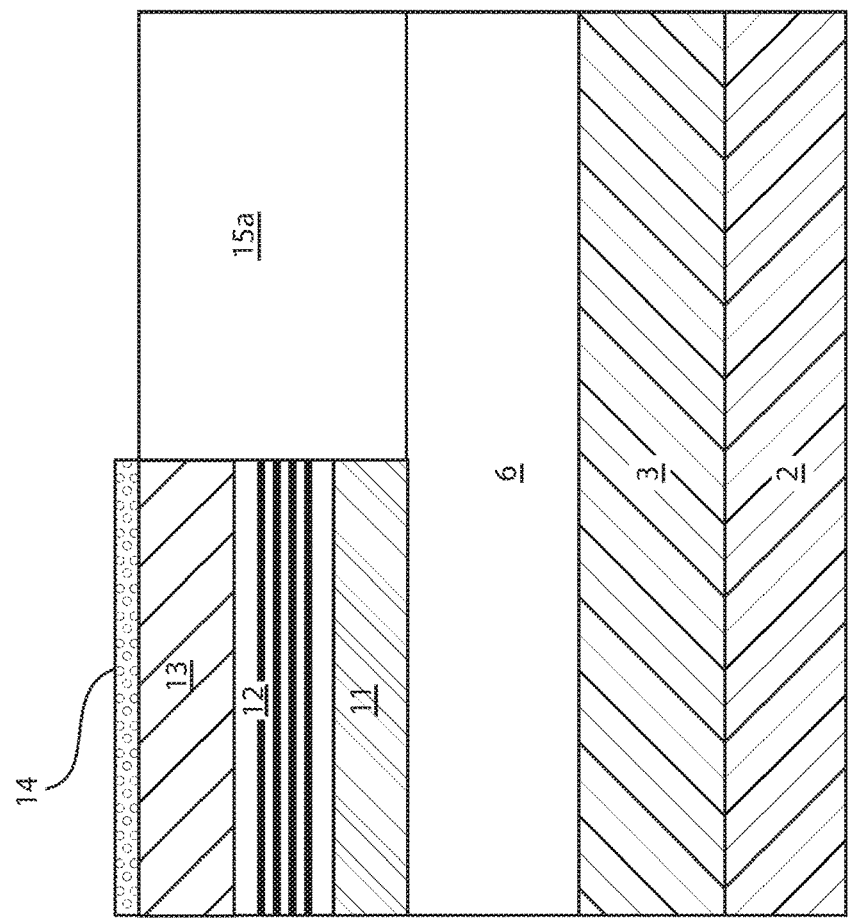
FIG. 9A depicts forming the dielectric material for a dielectric waveguide, in accordance with one embodiment of the present disclosure.

FIGS. 9A and 9B depict one embodiment of forming the dielectric material 15a for a dielectric waveguide 15. The dielectric material 15a for the dielectric waveguide may be blanket deposited on the structure depicted in FIGS. 8A and 8B using chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The dielectric material 15a may also be deposited using chemical solution deposition, spin or deposition, or in some cases may be formed using thermal growth processes, such as thermal oxidation, nitridation or a combination thereof. Following deposition, the upper surface of the dielectric material 15a may be planarized to be coplanar with the upper surface of the optoelectronic device 10. The planarization process may include chemical mechanical planarization.

The dielectric material 15a may then be patterned and etched to provide a dielectric waveguide 15 having the geometry depicted in FIG. 1B. Patterning the dielectric material 15 may include deposition, photolithography and etch processes. Specifically, in one example, a photoresist mask (not shown) is formed overlying the dielectric material 15A, in which the portion of the dielectric material 15A that is underlying the photoresist mask provides the dielectric waveguide 15. The exposed portions of the dielectric material 15A, which are not protected by the photoresist mask, are removed using a selective etch process. Following the formation of the photoresist mask, an etching process may remove the unprotected portions of the dielectric material 15A. For example, the transferring of the pattern provided by the photoresist into the underlying structures may include an anisotropic etch. The anisotropic etch may include reactive-ion etching (RIE). Other examples of anisotropic etching that can be used at this point of the present disclosure include ion beam etching, plasma etching or laser ablation.

Referring to FIG. 1C, in a following process sequence an interlevel dielectric layer 17 may be formed over the structure including the optoelectronic device 10 and the dielectric wave guide 15, and interconnects 18a, 18b, 19a, 19b are formed to the optoelectronic device 10. The interlevel dielectric layer 17 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the interlevel dielectric layer 17 include any of the aforementioned materials in porous form, or in a form that changes during processing to or from being porous and/or permeable to being non-porous and/or non-permeable. The deposited dielectric for the interlevel dielectric 17 is then patterned and etched to form via holes to the various contacts 16a, 16b of the photoelectronic device 10.

Following via formation, interconnects 18a, 18b, 19a, 19b are formed by depositing a conductive metal into the via holes using deposition methods, such as CVD, sputtering or plating. The conductive metal may include, but is not limited to: tungsten, copper, aluminum, silver, gold and alloys thereof.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
  removing a portion of a semiconductor on insulator (SOI) layer on a buried dielectric layer to form an island of a remaining portion of the SOI layer and exposing an upper surface of the buried dielectric layer;
  forming an isolation dielectric material on the island and the exposed surface of the buried dielectric layer;
  forming a via through the isolation dielectric material over the island that extends through the isolation dielectric material to expose a portion of the island;
  epitaxially forming a first III-V semiconductor material layer on the exposed surface of the island that extends through the via and over the isolation dielectric material;
  removing a portion of the first III-V semiconductor material layer over the island and in the via, wherein a first portion of the first III-V material layer remains on the isolation dielectric material; and
  forming an optoelectronic device on the remaining portion of the first III-V semiconductor material layer, wherein the optoelectronic device includes at least a stacked structure of quantum wells and a second III-V material layer on the stacked structure of quantum wells, wherein the isolation dielectric material is disposed between the III-V optoelectronic device and the buried dielectric layer.

2. The method of claim 1, further comprising forming a passivation dielectric layer on the second III-V material layer.

3. The method of claim 1, further comprising forming a dielectric waveguide in direct contact with the first III-V semiconductor material layer and stacked structure of quantum wells, and in direct contact with isolation dielectric material.

4. The method of claim 3, further comprising forming a first contact to the first III-V semiconductor material layer and a second contact to the second III-V material layer.

5. The method of claim 4, wherein the optoelectronic device has a width in a range from 3.75 microns to 4.25 microns.

6. The method of claim 5, wherein the isolation dielectric material is silicon nitride.

7. The method of claim 6, wherein the material of the first III-V semiconductor material layer is selected from the group of III-V materials consisting of indium phosphide (InP), gallium arsenide (GaAs), aluminum gallium arsenide (AlGaAs), and indium aluminum arsenide (InAlAs).

8. The method of claim 7, wherein the first III-V semiconductor material layer includes an n-type dopant.

9. The method of claim 8, wherein the first III-V semiconductor material layer has a dopant concentration ranging from $10^{17}$ atoms/cm$^3$ to $10^{20}$ atoms/cm$^3$.

10. A method of forming a semiconductor device comprising:
removing a portion of a semiconductor on insulator (SOI) layer on a buried dielectric layer to form an island of a remaining portion of the SOI layer and exposing an upper surface of the buried dielectric layer;
forming an isolation dielectric material on the island and the exposed surface of the buried dielectric layer;
forming a via through the isolation dielectric material over the island that extends through the isolation dielectric material to expose a portion of the island;
epitaxially forming a first III-V semiconductor material layer on the exposed surface of the island that extends through the via and over the isolation dielectric material, wherein the first III-V semiconductor material layer is doped to have an n-type conductivity;
removing a portion of the first III-V semiconductor material layer over the island and in the via, wherein a first portion of the first III-V material layer remains on the isolation dielectric material; and
forming an optoelectronic device on the remaining portion of the first III-V semiconductor material layer, wherein the optoelectronic device includes at least a stacked structure of quantum wells and a second III-V material layer on the stacked structure of quantum wells, wherein the isolation dielectric material is disposed between the III-V optoelectronic device and the buried dielectric layer.

11. The method of claim 10, wherein the first III-V semiconductor material layer has a dopant concentration ranging from $10^{17}$ atoms/cm$^3$ to $10^{20}$ atoms/cm$^3$.

12. The method of claim 11, wherein the material of the second III-V semiconductor material layer is selected from the group of III-V materials consisting of indium phosphide (InP), gallium arsenide (GaAs), aluminum gallium arsenide (AlGaAs), and indium aluminum arsenide (InAlAs).

13. The method of claim 11, wherein the second III-V semiconductor material layer includes a p-type dopant.

14. The method of claim 13, wherein the second III-V semiconductor material layer has a dopant concentration ranging from $10^{17}$ atoms/cm$^3$ to $10^{20}$ atoms/cm$^3$.

15. A method of forming a semiconductor device comprising:
patterning a substrate structure including a semiconductor on insulator (SOI) layer on a buried dielectric layer to provide a first portion of the substrate structure including an island of a remaining portion of the SOI layer and a second portion of the substrate structure having an exposed upper surface of the buried dielectric layer;
forming an isolation dielectric material on first and second portions of the substrate structure, wherein the isolation dielectric material is formed directly on the buried dielectric layer in the second portion of the substrate structure, and the isolation dielectric material is formed overlying the SOI layer in the first portion of the substrate structure, wherein a via extends through the isolation dielectric material to expose a seed portion of the SOI layer;
epitaxially forming a first III-V semiconductor material layer from the seed portion of the SOI layer extending over the isolation dielectric material from the first portion to the second portion of the substrate structure;
removing a portion of the first III-V semiconductor material layer that is present in the first portion of the substrate structure including the via, wherein a remaining portion of the first III-V material layer is present in the second portion of the substrate structure;
forming an optoelectronic device on the remaining portion of the first III-V semiconductor material layer, the optoelectronic device including at least a second III-V material layer; and
forming a dielectric waveguide directly on the dielectric material.

16. The method of claim 15, wherein epitaxially forming the first III-V semiconductor material layer from the seed portion of the SOI layer extending over the isolation dielectric material from the first portion to the second portion of the substrate structure comprises epitaxial growth of the first III-V semiconductor material layer to provide a defect region in the via, wherein as the first III-V semiconductor material layer is growth from the first portion to the second portion of the substrate structure the defect density decreases.

17. The method of claim 16, wherein the removing of the portion of the first III-V semiconductor material layer that is present in the first portion of the substrate structure including the via comprises an etch process that removes at least the defect region, wherein the remaining portion of the first III-V semiconductor material layer that is present in the second portion of the substrate structure has a defect density of $10^6$ defects/cm$^2$.

18. The method of claim 15, wherein the forming of the optoelectronic device on the remaining portion of the III-V material comprises:
forming a III-V semiconductor multiple quantum well layered stack on the first III-V semiconductor material layer;
forming a second III-V semiconductor material layer on the III-V multiple quantum well layer;
patterning the second III-V semiconductor material layer and the III-V multiple quantum well layered stack to expose a portion of the first III-V semiconductor material layer; and forming contacts to exposed portions of the first III-V semiconductor material layer and the second III-V semiconductor material layer.

19. The method of claim 15, wherein a dielectric of the dielectric wave guide is selected from the group consisting of silicon oxide, silicon nitride, silicon oxynitride, silicon carbide, hafnium oxide, aluminum oxide, silica and combinations thereof.

20. The method of claim 15, wherein the dielectric wave guide has a first width proximate to an emission face of the III-V optoelectronic device, wherein the dielectric wave guide tapers along its length to a second width that is less than the first width.

* * * * *